United States Patent
Ozaki

(10) Patent No.: US 10,312,344 B2
(45) Date of Patent: Jun. 4, 2019

(54) SEMICONDUCTOR DEVICE, MANUFACTURING METHOD OF SEMICONDUCTOR DEVICE, POWER UNIT, AND AMPLIFIER

(71) Applicant: FUJITSU LIMITED, Kawasaki-shi, Kanagawa (JP)

(72) Inventor: Shirou Ozaki, Yamato (JP)

(73) Assignee: FUJITSU LIMITED, Kawasaki (JP)

( * ) Notice: Subject to any disclaimer, the term of this patent is extended or adjusted under 35 U.S.C. 154(b) by 2 days.

(21) Appl. No.: 15/652,951

(22) Filed: Jul. 18, 2017

(65) Prior Publication Data
US 2018/0090595 A1 Mar. 29, 2018

(30) Foreign Application Priority Data

Sep. 28, 2016 (JP) .................. 2016-190285

(51) Int. Cl.
*H01L 29/66* (2006.01)
*H01L 21/02* (2006.01)
(Continued)

(52) U.S. Cl.
CPC .............. *H01L 29/66522* (2013.01); *H01L 21/02241* (2013.01); *H01L 21/28264* (2013.01);
(Continued)

(58) Field of Classification Search
CPC ........... H01L 29/66462; H01L 29/7786; H01L 21/02241; H01L 29/41766; H01L 29/513; H01L 29/517; H01L 29/2003
See application file for complete search history.

(56) References Cited

U.S. PATENT DOCUMENTS

| 6,064,082 A * | 5/2000 | Kawai ................. H01L 29/7783 257/191 |
| 2003/0102482 A1* | 6/2003 | Saxler ................. H01L 29/7783 257/85 |

(Continued)

FOREIGN PATENT DOCUMENTS

| JP | 2002-359256 | 12/2002 |
| JP | 2010-045343 | 2/2010 |

(Continued)

*Primary Examiner* — Charles D Garber
*Assistant Examiner* — S M Sohel Imtiaz
(74) *Attorney, Agent, or Firm* — Fujitsu Patent Center

(57) ABSTRACT

A semiconductor device includes a first semiconductor layer formed of a compound semiconductor, provided over a substrate; a second semiconductor layer formed of a compound semiconductor including In and Al, provided over the first semiconductor layer; source and drain electrodes provided on the second semiconductor layer; and a gate electrode provided between the source and drain electrodes, on the second semiconductor layer. The compound semiconductor in the second semiconductor layer has a first In composition ratio in a region on a side facing the substrate and a second In composition ratio in a region on an opposite side, the second In composition ratio being lower than the first In composition ratio, and the source and drain electrodes are provided in contact with the region having the first In composition ratio, and the gate electrode is provided on the region having the second In composition ratio.

10 Claims, 20 Drawing Sheets

(51) Int. Cl.
*H01L 21/306* (2006.01)
*H01L 21/28* (2006.01)
*H01L 29/205* (2006.01)
*H01L 29/778* (2006.01)
*H01L 29/417* (2006.01)
*H01L 29/423* (2006.01)
*H01L 29/20* (2006.01)
*H01L 29/51* (2006.01)

(52) U.S. Cl.
CPC ...... *H01L 21/30612* (2013.01); *H01L 29/205* (2013.01); *H01L 29/4175* (2013.01); *H01L 29/66462* (2013.01); *H01L 29/7786* (2013.01); *H01L 29/7787* (2013.01); *H01L 29/2003* (2013.01); *H01L 29/41766* (2013.01); *H01L 29/42376* (2013.01); *H01L 29/513* (2013.01); *H01L 29/517* (2013.01)

(56) References Cited

U.S. PATENT DOCUMENTS

| | | | | |
|---|---|---|---|---|
| 2011/0272741 | A1* | 11/2011 | Hwang | H01L 29/1029 257/194 |
| 2012/0313145 | A1* | 12/2012 | Makabe | H01L 21/02378 257/194 |
| 2013/0075753 | A1* | 3/2013 | Yamada | H01L 29/7787 257/76 |
| 2013/0075787 | A1* | 3/2013 | Kotani | H01L 29/66462 257/194 |
| 2013/0082278 | A1* | 4/2013 | Mizuno | H01L 29/404 257/76 |
| 2013/0102140 | A1 | 4/2013 | Derluyn et al. | |
| 2013/0320349 | A1 | 12/2013 | Saunier et al. | |
| 2014/0361308 | A1* | 12/2014 | Yui | H01L 21/0254 438/478 |
| 2015/0179429 | A1* | 6/2015 | Watanabe | H01L 21/0254 257/77 |
| 2015/0236101 | A1* | 8/2015 | Chiang | H01L 29/2003 257/194 |
| 2017/0054015 | A1* | 2/2017 | Nakata | H01L 29/7786 |
| 2017/0077283 | A1* | 3/2017 | Nakata | H01L 29/7787 |

FOREIGN PATENT DOCUMENTS

| | | |
|---|---|---|
| JP | 2013-222800 | 10/2013 |
| JP | 2013-235986 | 11/2013 |
| JP | 2013-251544 | 12/2013 |

* cited by examiner

| ELECTRON SUPPLY LAYER 923 | In | Al | N | In/Al RATIO |
|---|---|---|---|---|
| CRYSTAL SURFACE LAYER 923a | 3 | 44 | 53 | 0.07 |
| CRYSTAL INNER LAYER 923b | 9 | 41 | 50 | 0.22 |

SEMICONDUCTOR DEVICE, MANUFACTURING METHOD OF SEMICONDUCTOR DEVICE, POWER UNIT, AND AMPLIFIER

CROSS-REFERENCE TO RELATED APPLICATION

This patent application is based upon and claims the benefit of priority of the prior Japanese Patent Application No. 2016-190285 filed on Sep. 28, 2016, the entire contents of which are incorporated herein by reference.

FIELD

The embodiments discussed herein are related to a semiconductor device, a manufacturing method of semiconductor device, a power unit, and an amplifier.

BACKGROUND

GaN, AlN, and InN, etc., which are nitride semiconductors, or materials made of mixed crystals of these nitride semiconductors, have a wide band gap, and are used as high output electronic devices or short-wavelength light emitting devices. Among these, as high output devices, technologies are developed in relation to field effect transistors (FET), more particularly, High Electron Mobility Transistors (HEMT) (see, for example, Patent Document 1). A HEMT using such a nitride semiconductor is used for high output/ high efficiency amplifiers and high power switching devices.

As a field effect transistor using a nitride semiconductor, there is a HEMT in which GaN is used as an electron transport layer and AlGaN is used as an electron supply layer. In the electron transport layer, 2DEG (Two-Dimensional Electron Gas) is generated, by the functions of piezoelectric polarization and spontaneous polarization in GaN. Furthermore, in order to respond to demand for high output and high efficiency of the HEMT, there is a HEMT in which GaN is used in the electron transport layer and InAlN is used in the electron supply layer. Because InAlN has high spontaneous polarization, by using InAlN in the electron supply layer, a high concentration of 2DEG is induced, and it is possible to cause more drain currents to flow in the electron supply layer, compared to the case of a HEMT using AlGaN.

Patent Document 1: Japanese Laid-Open Patent Publication No. 2002-359256
Patent Document 2: Japanese Laid-Open Patent Publication No. 2010-45343
Patent Document 3: Japanese Laid-Open Patent Publication No. 2013-251544
Patent Document 4: Japanese Laid-Open Patent Publication No. 2013-222800
Patent Document 5: Japanese Laid-Open Patent Publication No. 2013-235986

SUMMARY

According to an aspect of the embodiments, a semiconductor device includes a first semiconductor layer formed of a compound semiconductor, provided over a substrate; a second semiconductor layer formed of a compound semiconductor including In and Al, provided over the first semiconductor layer; a source electrode and a drain electrode provided on the second semiconductor layer; and a gate electrode provided between the source electrode and the drain electrode, on the second semiconductor layer, wherein the compound semiconductor in the second semiconductor layer has a first In composition ratio in a region of the second semiconductor layer on a side facing the substrate and a second In composition ratio in a region of the second semiconductor layer on a side opposite to the side facing the substrate, the second In composition ratio being a lower In composition ratio than the first In composition ratio, and the source electrode and the drain electrode are provided in contact with the region having the first In composition ratio, and the gate electrode is provided on the region having the second In composition ratio.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF EMBODIMENTS

Figure 1:
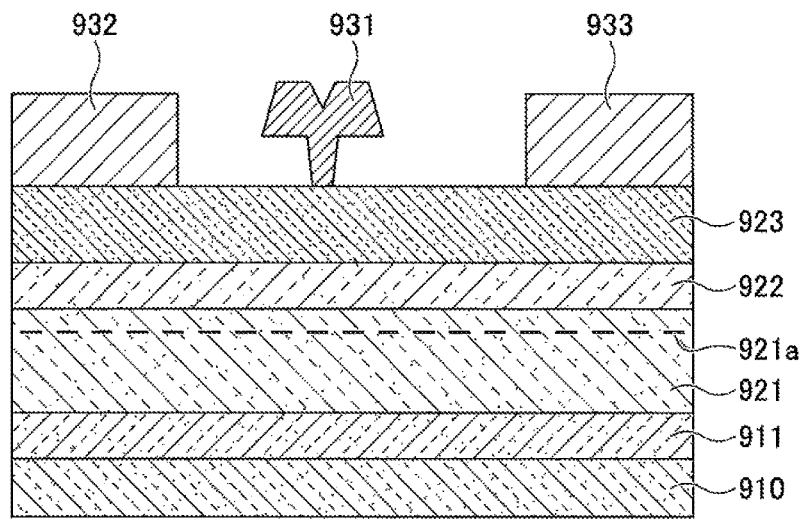
FIG. 1 is a structural diagram of a semiconductor device in which an electron transport layer is formed of InAlN (1)

Preferred embodiments of the present invention will be explained with reference to accompanying drawings. Note that the same members, etc., are denoted by the same reference numerals, and overlapping descriptions are omitted.

First Embodiment

First, a description is given of a HEMT using InAlN in the electron supply layer.

As illustrated in FIG. 1, a HEMT using InAlN in the electron supply layer is formed by depositing a buffer layer 911, an electron transport layer 921, a spacer layer 922, and an electron supply layer 923, in a layered manner on a substrate 910, by epitaxial growth of nitride semiconductors. Note that these layers are formed by MOVPE (Metal Organic Vapor Phase Epitaxy). The substrate 910 is formed of SiC, etc., and the buffer layer 911 is formed of AlN and GaN, etc. The electron transport layer 921 is formed of i-GaN, the spacer layer 922 is formed of AlN, and the electron supply layer 923 is formed of $In_{0.18}Al_{0.82}N$. Accordingly, near the interface between the electron transport layer 921 and the spacer layer 922 in the electron transport layer 921, 2DEG 921a is generated. On the electron supply layer 923, a gate electrode 931, a source electrode 932, and a drain electrode 933 are formed.

It is to be noted that, when the inventor of the present application actually fabricated a HEMT having the structure illustrated in FIG. 1, the ON-resistance was high, and properties as a HEMT were not very preferable. Therefore, upon earnestly examining the reason why the ON-resistance increases, it was found that the In separates from the surface of the InAlN forming the electron supply layer 923, the composition ratio of In was decreased, and the film became AlN-rich.

Figure 2:
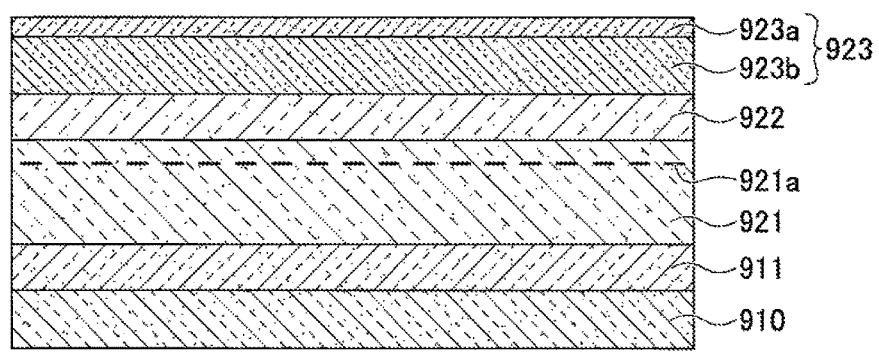
FIG. 2 is a diagram for describing a crystal surface layer and a crystal inner layer of the electron transport layer.
Figures 3, 4:
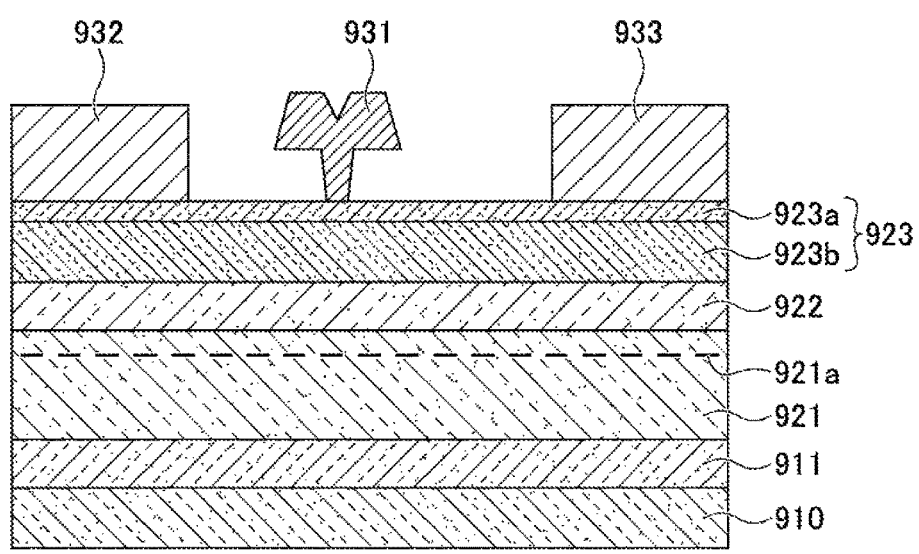
FIG. 3 is a diagram for describing the analysis of the crystal surface layer and the crystal inner layer by XPS.
FIG. 4 is a structural diagram of a semiconductor device in which an electron transport layer is formed of InAlN (2)

Specifically, as illustrated in FIG. 2, a sample was fabricated by depositing the buffer layer 911, the electron transport layer 921, the spacer layer 922, and the electron supply layer 923 in a layered manner on the substrate 910, by epitaxial growth of nitride semiconductors. In the sample fabricated as above, an analysis was performed by XPS (X-ray Photoelectron Spectroscopy), in a crystal surface layer 923a on the surface of the electron supply layer 923 and a crystal inner layer 923b that is deeper than the crystal surface layer 923a. Results obtained by this analysis are illustrated in FIG. 3. Note that the ratios of the respective elements in FIG. 3 are the ratios of atomic elements in the crystal surface layer 923a and the crystal inner layer 923b of the electron supply layer 923. As illustrated in FIG. 3, in the crystal inner layer 923b of the electron supply layer 923, desirable composition ratios of In:3, Al:41, and N:50 were obtained, whereas in the crystal surface layer 923a of the electron supply layer 923, the composition ratios were In:3, Al:44, N:53. That is, in the crystal inner layer 923b of the electron supply layer 923, the ratio of In with respect to Al (In/Al ratio) was 0.22, whereas in the crystal surface layer 923a, the ratio of In with respect to Al (In/Al ratio) was 0.07.

Therefore, in the crystal surface layer 923a of the electron supply layer 923, the composition ratio of In decreases from the initial composition, and the composition ratio of Al increases relatively, and therefore the film becomes AlN-rich. When the composition ratio of Al increases, the properties of InAlN become close to those of AlN and the resistance increases. Thus, when the source electrode 932 and the drain electrode 933 are formed on the crystal surface layer 923a of the electron supply layer 923, the resistance in between the source electrode 932, the drain electrode 933, and the 2DEG 921a increases, and the ON-resistance increases. That is, in the semiconductor device illustrated in FIG. 1, the crystal surface layer 923a, in which the In is separated, is formed on the surface of the electron supply layer 923, and the source electrode 932 and the drain electrode 933 are formed on this crystal surface layer 923a in which the In is separated. For this reason, it is considered that the ON resistance increases.

It is to be noted that, the reason why the film becomes AlN-rich in the crystal surface layer 923a on the surface of the electron supply layer 923 as described above, is considered to be that the In tends to separate easily in a state where the melting point is low and the temperature is high. The electron supply layer 923 is formed by epitaxial growth according to MOVPE, and the temperature is approximately 750° C. when forming the electron supply layer 923. After finishing forming the electron supply layer 923, the temperature is decreased; however, at the initial stage of this temperature decreasing process, the temperature is relatively high, and therefore In tends to be separated from the surface of the electron supply layer 923. For this reason, in the crystal surface layer 923a on the surface of the electron supply layer 923, it is considered that the In is separated and the film becomes AlN-rich.

Semiconductor Device—First Embodiment

Figure 5:
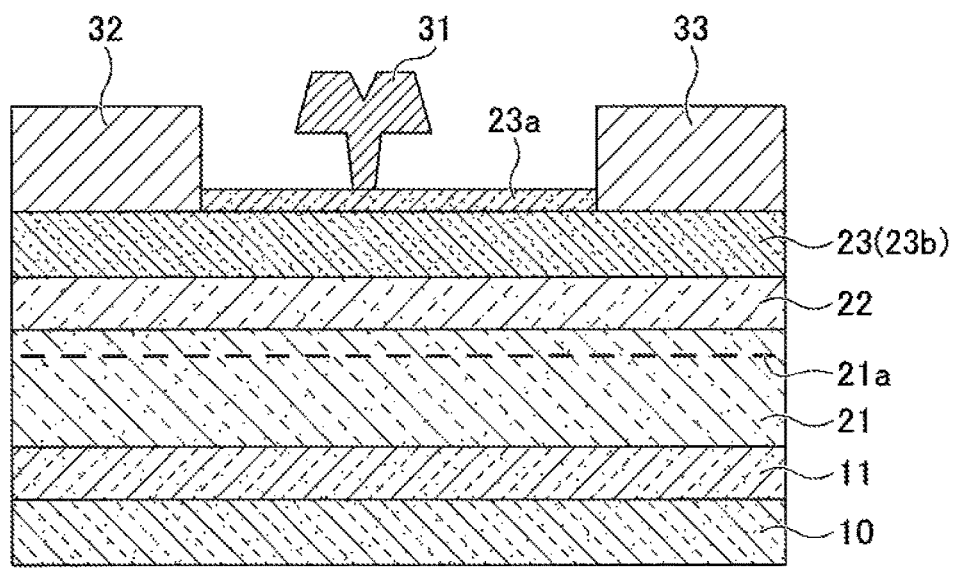
FIG. 5 is a structural diagram of a semiconductor device according to a first embodiment.

Next, a description is given of a semiconductor device according to the present embodiment. As illustrated in FIG. 5, the semiconductor device according to the present embodiment is a HEMT in which InAlN is used in the electron supply layer. Specifically, the semiconductor device is formed by depositing a buffer layer 11, an electron transport layer 21, a spacer layer 22, and an electron supply layer 23 in a layered manner on a substrate 10, by epitaxial growth of nitride semiconductors according to MOVPE. The substrate 10 is formed of SiC, etc., and the buffer layer 11 is formed of AlN and GaN, etc. The electron transport layer 21 is formed of i-GaN, the spacer layer 22 is formed of AlN, and the electron supply layer 23 is formed of $In_{0.18}Al_{0.82}N$. Accordingly, near the interface between the electron transport layer 21 and the spacer layer 22 in the electron transport layer 21, 2DEG 21a is generated. In the present embodiment, the electron transport layer 21 may be referred to as a first semiconductor layer and the electron supply layer 23 may be referred to as a second semiconductor layer.

In the electron supply layer 23, an AlN-rich crystal surface layer 23a, in which In is separated from the surface of the electron supply layer 23, is formed, and a crystal inner layer 23b, in which In is not separated, is formed at a deeper part than the crystal surface layer 23a in the electron supply layer 23. The thickness of the crystal surface layer 23a of the electron supply layer 23 is approximately 2 nm. In the semiconductor device according to the present embodiment, a gate electrode 31 is formed on the crystal surface layer 23a of the electron supply layer 23; however, a source electrode 32 and a drain electrode 33 are formed on the crystal inner layer 23b of the electron supply layer 23.

Therefore, although the electron supply layer 23 is formed of InAlN, the crystal surface layer 23a on the surface of the electron supply layer 23 has both a lower composition ratio of In and a higher composition ratio of Al than the crystal inner layer 23b inside the electron supply layer 23, and the crystal surface layer 23a has a higher resistance than the crystal inner layer 23b. Furthermore, based on FIG. 3, the crystal surface layer 23a has a higher composition ratio of N than the crystal inner layer 23b. Note that in the present embodiment, the crystal inner layer 23b may be referred to as a region having a first In composition ratio, and the crystal surface layer 23a may be referred to as a region having a second In composition ratio.

In the semiconductor device according to the present embodiment, the source electrode 32 and the drain electrode 33 are formed on the crystal inner layer 23b where the resistance is low. Therefore, as the resistance in between the source electrode 32, the drain electrode 33, and the 2DEG 21a is low, it is possible to decrease the ON-resistance. Furthermore, the gate electrode 31 is formed on the crystal surface layer 23a where the resistance is high, and therefore the gate leakage current is reduced.

Note that in the semiconductor device according to the present embodiment, InAlGaN may be used as the electron supply layer 23; and furthermore, the semiconductor device according to the present embodiment is also applicable to a semiconductor device using a compound semiconductor including In and Al such as InAlAs and InAlP, etc., in the electron supply layer 23.

(Manufacturing Method of Semiconductor Device—First Embodiment)

Figure 6A:
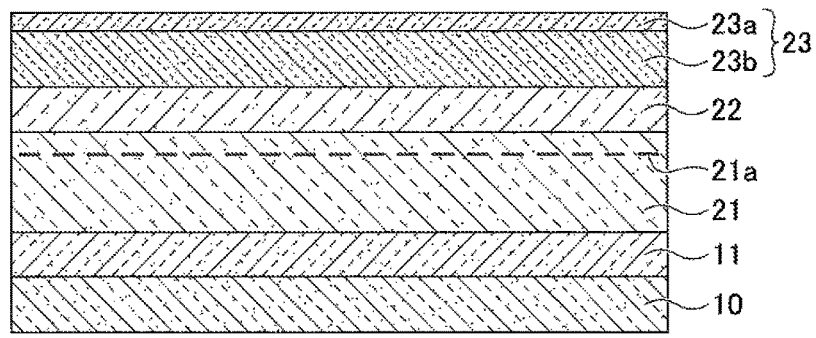
FIGS. 6A through 6C are process drawings of a method of manufacturing the semiconductor device according to the first embodiment (1)
Figure 6B:
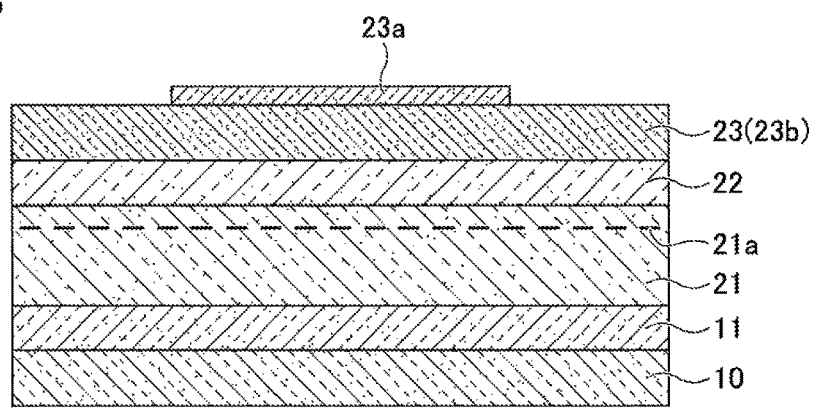
Figure 6C:
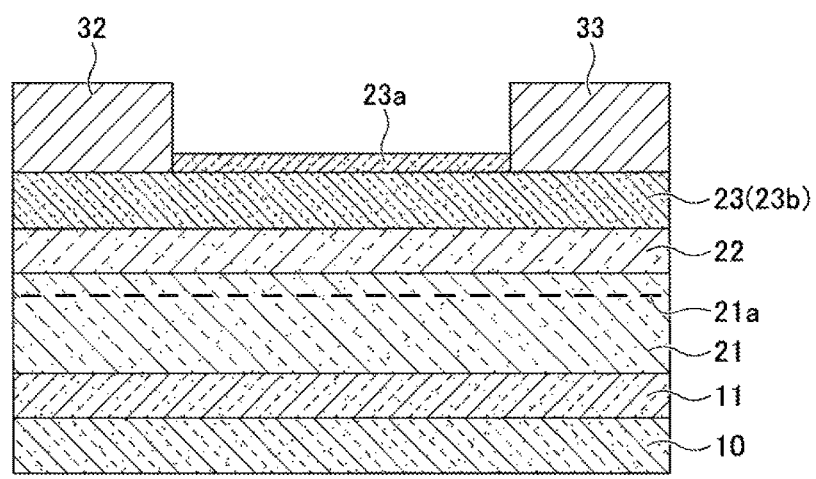
Figure 7:
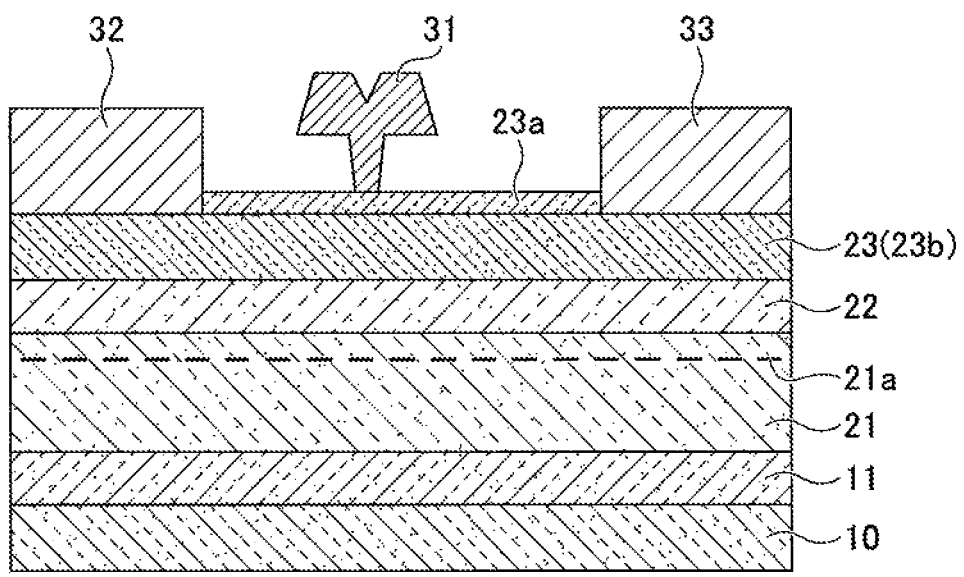
FIG. 7 is a process drawing of a method of manufacturing the semiconductor device according to the first embodiment (2)

Next, a description is given of the manufacturing method of the semiconductor device according to the present embodiment, by referring to FIGS. 6A through 7.

First, as illustrated in FIG. 6A, by epitaxially growing nitride semiconductor layers, the buffer layer 11, the electron transport layer 21, the spacer layer 22, and the electron supply layer 23 are formed on the substrate 10. Accordingly, the 2DEG 21a is generated in the electron transport layer 21, near the interface between the electron transport layer 21 and the spacer layer 22. The nitride semiconductor layers are formed by epitaxial growth according to MOVPE (Metal Organic Vapor Phase Epitaxy). Note that these nitride semiconductor layers may be formed by MBE (Molecular Beam Epitaxy), instead of by MOVPE.

As the substrate 10, for example, a sapphire substrate, a Si substrate, a SiC substrate, and a GaN substrate may be used. In the present embodiment, a SiC substrate is used as the substrate 10. The buffer layer 11 is formed by AlGaN, etc., the electron transport layer 21 is formed by i-GaN, the spacer layer 22 is formed by AlN, and the electron supply layer 23 is formed by $In_{0.18}Al_{0.82}N$.

When these nitride semiconductor layers are formed by MOVPE, TMI (trimethyl indium) is used as the raw material gas of In, TMA (trimethyl aluminum) is used as the raw material gas of Al, and TMG (trimethyl gallium) is used as the raw material gas of Ga. Furthermore, $NH_3$ (ammonia) is used as the raw material gas of N. Note that these types of raw material gas are supplied to a reacting furnace of a MOVPE device, by using hydrogen ($H_2$) as the carrier gas.

The electron transport layer 21 and the spacer layer 22 are formed by epitaxial growth at a growth temperature of approximately 1000° C., and the electron supply layer 23 is formed by epitaxial growth at a growth temperature of approximately 750° C. After forming the electron supply layer 23, in the process of decreasing the temperature, part of the In on the surface of the electron supply layer 23 separates and the crystal surface layer 23a is formed. Therefore, in the crystal surface layer 23a, the composition ratio of In is low and the composition ratio of Al is high, compared to those of the crystal inner layer 23b that is at a deeper part than the crystal surface layer 23a. The thickness of the crystal surface layer 23a that is formed as described above is approximately 2 nm. Note that in order to increase the AlN component in the crystal surface layer 23a, a nitrogen plasma process or an ammonia process in a heated state may be performed, to separate even more In components. By increasing the AlN component in the crystal surface layer 23a, it is possible to further reduce the gate leakage current.

Subsequently, although not illustrated, an element separation region for separating the elements is formed. Specifically, photoresist is applied on the electron supply layer 23, and exposing and developing are performed with an exposing device to form a resist pattern having an opening in the region where the element separation region is to be formed. Subsequently, argon (Ar) ions are injected into the nitride semiconductor layer in a region where the resist pattern is not formed, to thereby form the element separation region. The element separation region may be formed by removing a part of the nitride semiconductor layer in a region where the resist pattern is not formed, by dry etching such as RIE (Reactive Ion Etching). After forming the element separation region, the resist pattern is removed with an organic solvent.

Next, as illustrated in FIG. 6B, the crystal surface layer 23a of the electron supply layer 23 is removed from the regions where the source electrode 32 and the drain electrode 33 are to be formed. Specifically, photoresist is applied on the electron supply layer 23, and exposing and developing are performed with an exposing device to form a resist pattern (not illustrated) having openings in the regions where the source electrode 32 and the drain electrode 33 are to be formed. Subsequently, the crystal surface layer 23a in the regions where the resist pattern is not formed, is removed by dry etching with the use of chlorine gas as the etching gas, to expose the crystal inner layer 23b of the electron supply layer 23. Subsequently, the resist pattern (not illustrated) is removed by an organic solvent, etc.

Next, as illustrated in FIG. 6C, the source electrode 32 and the drain electrode 33 are formed on the crystal inner layer 23b of the electron supply layer 23. Specifically, a photoresist is applied on the crystal surface layer 23a and the crystal inner layer 23b of the electron supply layer 23, and exposing and developing are performed with an exposing device to form a resist pattern (not illustrated) having opening parts in the regions where the source electrode 32 and the drain electrode 33 are to be formed. Subsequently, a metal layered film formed of Ti/Al is formed by vacuum vapor deposition. Subsequently, by immersing the above in an organic solvent, the metal layered film formed on the resist pattern is lifted off and removed together with the resist pattern. Accordingly, the source electrode 32 and the drain electrode 33 are formed by the metal layered film remaining on the crystal inner layer 23b of the electron supply layer 23. Note that a Ti film and an Al film are formed in the stated order on the electron supply layer 23, to form the metal layered film formed of Ti/Al. Subsequently, by performing heat treatment at a temperature of approximately 400° C. through 1000° C. in a nitrogen atmosphere, the source electrode 32 and the drain electrode 33 are caused to come in ohmic contact with each other.

Next, as illustrated in FIG. 7, the gate electrode 31 is formed on the crystal surface layer 23a of the electron supply layer 23. Specifically, a photoresist is applied on the crystal surface layer 23a of the electron supply layer 23, the source electrode 32, and the drain electrode 33, and exposing and developing are performed with an exposing device to form a resist pattern (not illustrated) having an opening part in the region where the gate electrode 31 is to be formed. Subsequently, a metal layered film formed of Ni/Au is formed by vacuum vapor deposition. Subsequently, by immersing the above in an organic solvent, the metal layered film formed on the resist pattern is lifted off and removed together with the resist pattern. Accordingly, the gate electrode 31 is formed by the metal layered film remaining on the crystal surface layer 23a of the electron supply layer 23. Note that a Ni film and an Au film are formed in the stated order on the electron supply layer 23, to form the metal layered film formed of Ni/Au.

According to the above processes, the semiconductor device according to the present embodiment is manufactured.

In the above manufacturing method, a description is given of a case of removing the crystal surface layer 23a of the electron supply layer 23 by dry etching; however, the crystal surface layer 23a of the electron supply layer 23 may be removed by wet etching instead of by dry etching. This is because, in dry etching, plasma is used, and therefore plasma damage is caused on the surface of the crystal inner layer 23b of the electron supply layer 23 that has been etched, and the properties may be reduced; however, by wet etching, plasma damage, etc., is not caused.

Figure 8A:
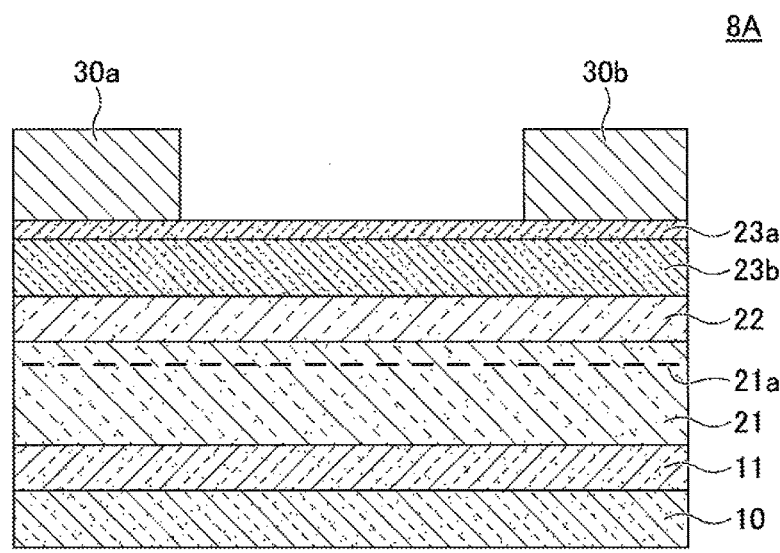
FIGS. 8A and 8B are diagrams for describing the structures of samples 8A, 8B, and 8C fabricated for measuring the contact resistance.
Figure 8B:
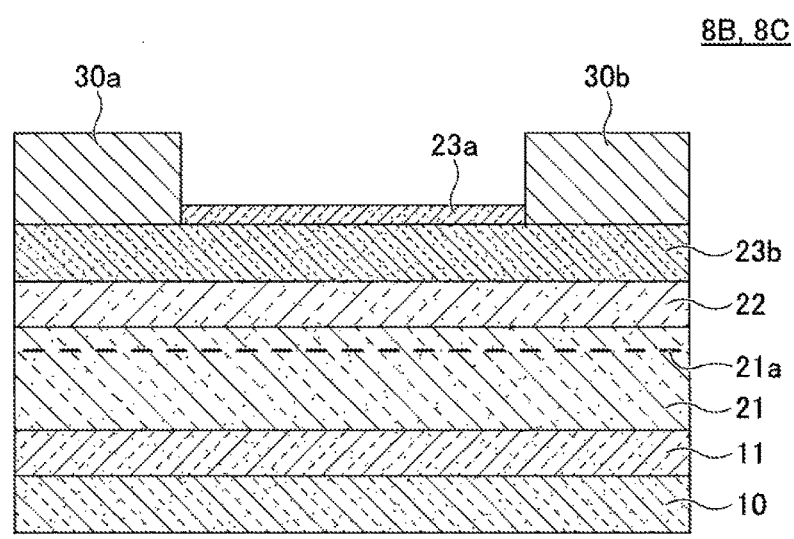

Next, a description is given of results obtained by measuring a contact resistance $\rho_c$, in a case of not etching the crystal surface layer of the electron supply layer, a case of removing the crystal surface layer of the electron supply layer by dry etching, and a case of removing the crystal surface layer of the electron supply layer by wet etching. Specifically, as illustrated in FIG. 8A, a sample 8A in which electrodes 30a and 30b are formed without etching the crystal surface layer 23a, and as illustrated in FIG. 8B, samples 8B and 8C in which the electrodes 30a and 30b are formed by etching the crystal surface layer 23a, were fabricated. Note that the sample 8B was formed by removing the crystal surface layer 23a of the electron supply layer 23 by dry etching, and the sample 8C was formed by removing the crystal surface layer 23a of the electron supply layer 23 by wet etching. In the present embodiment, the resistance in between the electrode 30a and the electrode 30b in the samples 8A, 8B, and 8C was assumed to be a contact resistance $\rho_c$, and results obtained by measuring this contact resistance $\rho_c$ are indicated in FIG. 9.

Figure 9:
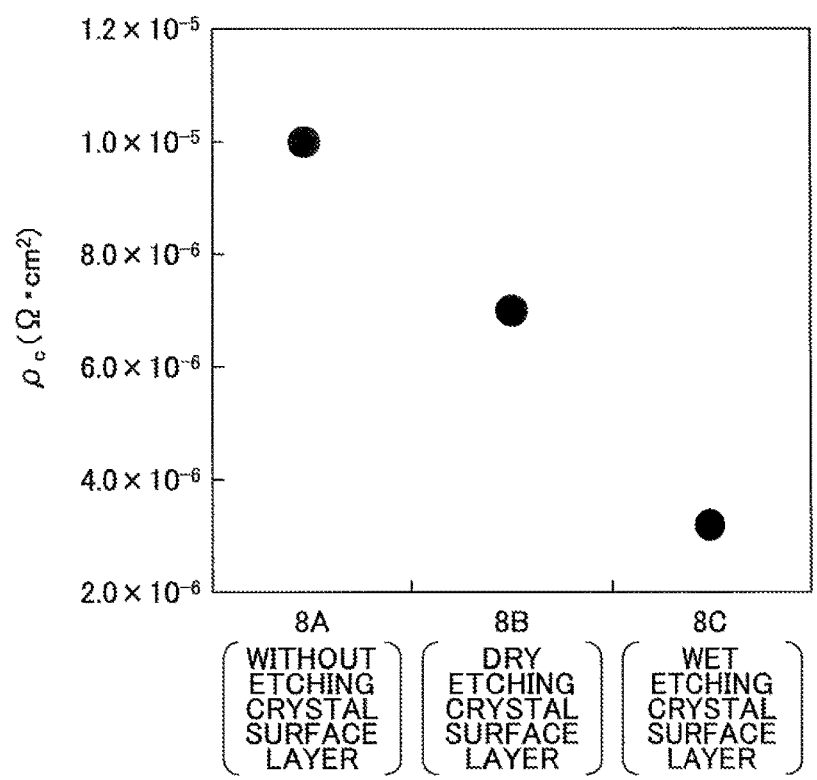
FIG. 9 is a diagram for describing the results of measuring the contact resistance of the samples 8A, 8B, and 8C.

As indicated in FIG. 9, with respect to the sample 8A in which the electrodes 30a and 30b were formed without etching the crystal surface layer 23a, the contact resistance $\rho_c$ was approximately $1.0 \times 10^{-5}$ $\Omega \cdot cm^2$. However, with respect to the sample 8B in which the electrodes 30a and 30b were formed by dry etching the crystal surface layer 23a, the contact resistance $\rho_c$ was approximately $5.0 \times 10^{-6}$ $\Omega \cdot cm^2$, thus the contact resistance $\rho_c$ was approximately half that of the sample 8A. Furthermore, with respect to the sample 8C in which the electrodes 30a and 30b were formed by wet etching the crystal surface layer 23a, the contact resistance $\rho_c$ was approximately $3.0 \times 10^{-6}$ $\Omega \cdot cm^2$, thus the contact resistance $\rho_c$ was less than or equal to one third of that of the sample 8A.

Therefore, by forming the electrodes 30a and 30b by etching the crystal surface layer 23a of the electron supply layer 23, it is possible to reduce the contact resistance $\rho_c$. In the semiconductor device according to the present embodiment, the electrode 30a corresponds to the source electrode 32 and the electrode 30b corresponds to the drain electrode 33. Therefore, in the semiconductor device according to the present embodiment, by removing the crystal surface layer 23a in the regions where the source electrode 32 and the drain electrode 33 are to be formed, it is possible to reduce the resistance in between the source electrode 32 and the drain electrode 33, and it is possible to reduce the ON-resistance.

Furthermore, as indicated in FIG. 9, the contact resistance $\rho_c$ is low in the sample 8C in which the crystal surface layer 23a of the electron supply layer 23 was removed by wet etching, compared to the contact resistance $\rho_c$ of the sample 8B in which the crystal surface layer 23a of the electron supply layer 23 was removed by dry etching. This is because, in the sample 8B, as the crystal surface layer 23a was removed by dry etching, it is considered that damage has been caused by plasma on the surface of the crystal inner layer 23b of the electron supply layer 23 exposed by etching. Therefore, it is preferable to perform wet etching rather than dry etching, when removing the crystal surface layer 23a.

Second Embodiment

Figure 10:
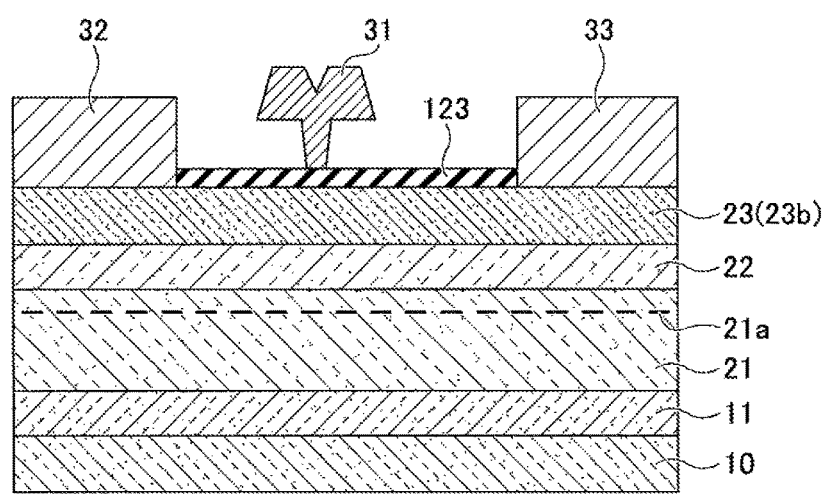
FIG. 10 is a structural diagram of a semiconductor device according to a second embodiment.

Next, a description is given of a second embodiment. A semiconductor device according to the present embodiment is a semiconductor device having a structure in which the crystal surface layer 23a of the electron supply layer 23 is oxidized. Specifically, as illustrated in FIG. 10, the semiconductor device has a structure in which the AlN-rich InAlN in the crystal surface layer 23a is oxidized to form an oxide film 123 by aluminum oxide (AlOx), and the gate electrode 31 is formed on the oxide film 123. In the present embodiment, the source electrode 32 and the drain electrode 33 are formed on the electron supply layer 23 that is formed by the crystal inner layer 23b. Furthermore, the aluminum oxide, which is formed as the oxide film 123, has a higher insulation property than that of AlN, etc., and therefore the gate leakage current is even further reduced.

(Manufacturing Method of Semiconductor Device—Second Embodiment)

Next, a description is given of the manufacturing method of the semiconductor device according to the present embodiment, by referring to FIGS. 11A through 12B.

Figure 11A:
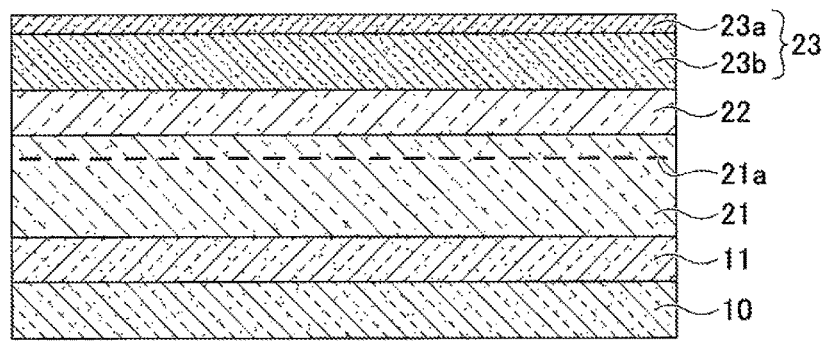
FIGS. 11A through 11C are process drawings of a method of manufacturing the semiconductor device according to the second embodiment (1)

First, as illustrated in FIG. 11A, by epitaxially growing nitride semiconductor layers, the buffer layer 11, the electron transport layer 21, the spacer layer 22, and the electron supply layer 23 are formed on the substrate 10. Subsequently, although not illustrated, an element separation region for separating the elements is formed.

Figure 11B:
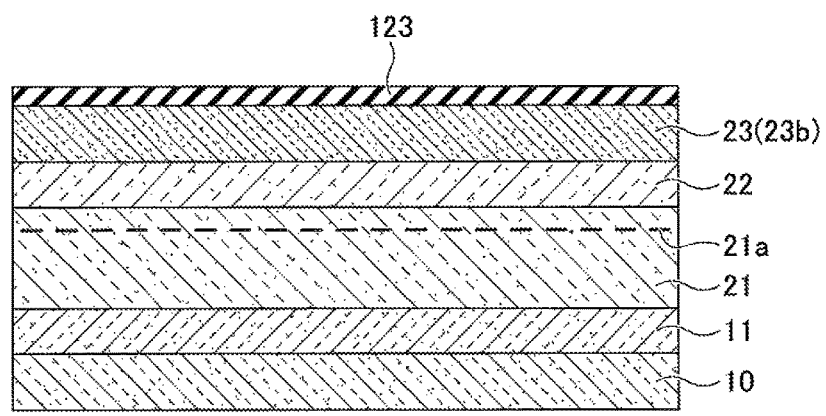

Next, as illustrated in FIG. 11B, the oxide film 123 is formed by oxidizing the crystal surface layer 23a of the electron supply layer 23. Specifically, water vapor having a temperature of 300° C. through 500° C. is used to oxidize the AlN-rich InAlN in the crystal surface layer 23a exposed on the surface, to form the oxide film 123. In this process of water vapor oxidation, the In components become In(OH)x and are sublimed, and therefore the oxide film 123, which mainly includes components of an aluminum oxide film, is formed. Note that in order to promote the sublimation of In(OH)x, this process is preferably performed in vacuum. The oxide film 123, which is formed by performing water vapor oxidation on the InAlN as described above, preferably has a film thickness of less than or equal than 5 nm, and in the present embodiment, the film thickness is approximately 2 nm.

Figure 11C:
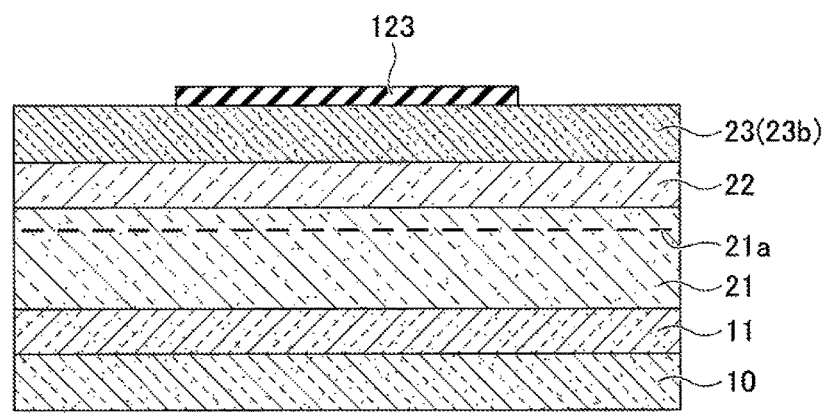

Next, as illustrated in FIG. 11C, the oxide film 123 is removed from the regions where the source electrode 32 and the drain electrode 33 are to be formed, and the electron supply layer 23 formed by the crystal inner layer 23b is exposed. Specifically, photoresist is applied on the oxide film 123, and exposing and developing are performed with an exposing device to form a resist pattern (not illustrated) having openings in the regions where the source electrode 32 and the drain electrode 33 are to be formed. Subsequently, wet etching is performed by using an alkali aqueous solution to remove the oxide film 123 from the region where the resist pattern is not formed, and to expose the surface of the electron supply layer 23 formed by the crystal inner layer 23b. In the present embodiment, In is included at a desired composition ratio in the electron supply layer 23 formed by the crystal inner layer 23b. The etching liquid that is used in the wet etching process is preferably an alkali aqueous solution such as KOH (potassium hydroxide) or TMAH (Tetramethylammonium hydroxide), etc. As the etching liquid, an acid such as a buffered hydrogen fluoride may be used; however, an alkali aqueous solution is more preferable in that InAlN is not easily etched and the etching selectivity is high; particularly, TMAH is preferable. Subsequently, the resist pattern (not illustrated) is removed with an organic solvent, etc.

Figure 12A:
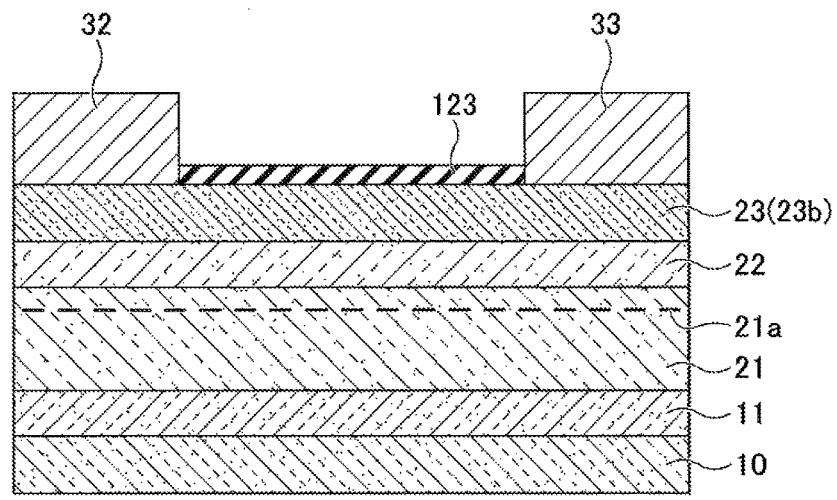
FIGS. 12A and 12B are process drawings of a method of manufacturing the semiconductor device according to the second embodiment (2)

Next, as illustrated in FIG. 12A, the source electrode 32 and the drain electrode 33 are formed on the electron supply layer 23 formed by the crystal inner layer 23b.

Figure 12B:
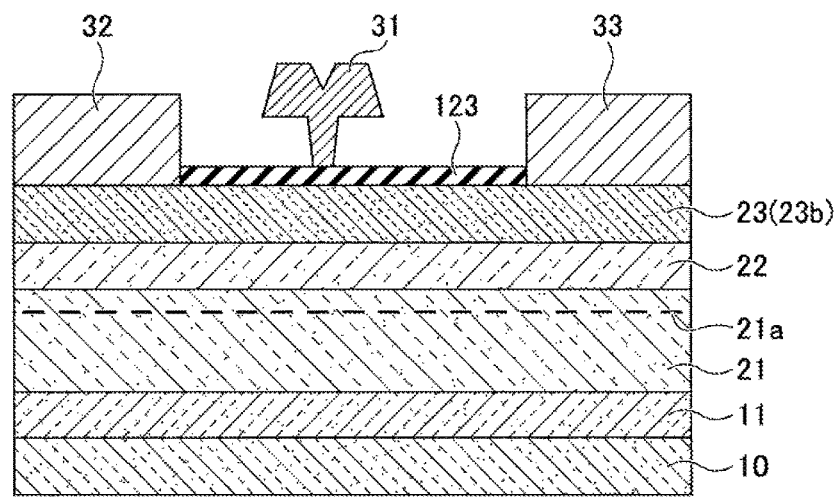

Next, as illustrated in FIG. 12B, the gate electrode 31 is formed on the oxide film 123.

According to the above processes, the semiconductor device according to the present embodiment is manufactured. The removal of the oxide film 123 from the regions where the source electrode 32 and the drain electrode 33 are to be formed, may be performed by dry etching instead of by wet etching, although the properties of the semiconductor device may be slightly reduced.

Note that contents other than the above are the same as those of the first embodiment.

Third Embodiment

Figure 13:
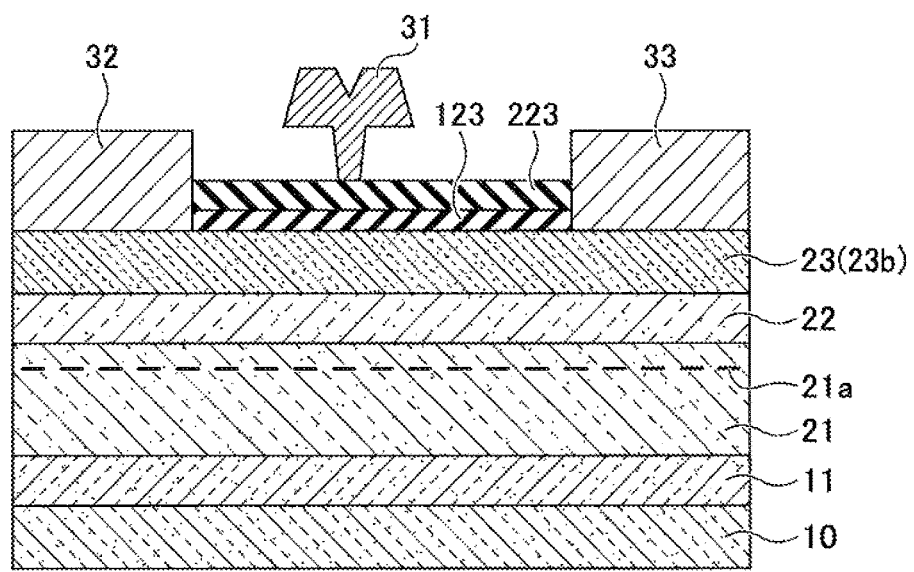
FIG. 13 is a structural diagram of a semiconductor device according to a third embodiment.

Next, a description is given of a third embodiment. As illustrated in FIG. 13, the semiconductor device according to the present embodiment has a structure in which an insulating film 223 is formed on the oxide film 123 of the semiconductor device according to the second embodiment, and the gate electrode 31 is formed on the insulating film 223. In the present embodiment, the insulating film 223 is described as being formed by aluminum oxide having a film thickness of 20 nm; however, the insulating film 223 may be a film having insulation properties such as silicon nitride, etc. Note that by forming the insulating film 223 and the oxide film 123 by the same aluminum oxide, as described below, it is possible to remove the insulating film 223 and the oxide film 123 by the same etching liquid, and is thus preferable from the viewpoint of manufacturing, etc. In the present embodiment, the source electrode 32 and the drain electrode 33 are formed on the electron supply layer 23 formed by the crystal inner layer 23b. By forming the insulating film 223 as described above, it is possible to further reduce the gate leakage current.

(Manufacturing Method of Semiconductor Device—Third Embodiment)

Next, a description is given of the manufacturing method of the semiconductor device according to the present embodiment, by referring to FIGS. 14A through 15C.

Figure 14A:
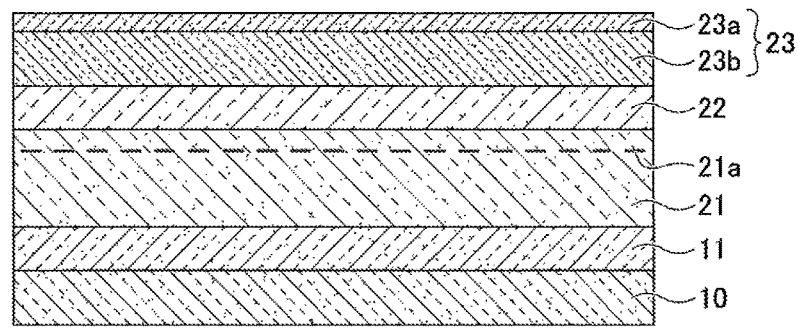
FIGS. 14A through 14C are process drawings of a method of manufacturing the semiconductor device according to the third embodiment (1)

First, as illustrated in FIG. 14A, by epitaxially growing nitride semiconductor layers, the buffer layer 11, the electron transport layer 21, the spacer layer 22, and the electron supply layer 23 are formed on the substrate 10. Subsequently, although not illustrated, an element separation region for separating the elements is formed.

Figure 14B:
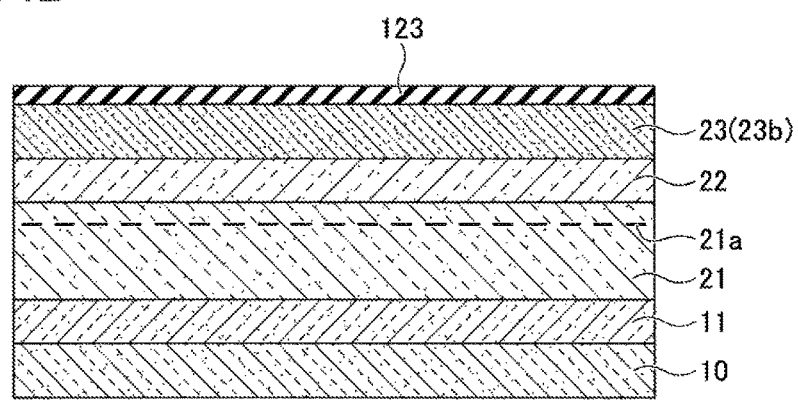

Next, as illustrated in FIG. 14B, the oxide film 123 is formed by oxidizing the crystal surface layer 23a of the electron supply layer 23. The oxide film 123, which is formed by performing water vapor oxidation on the InAlN as described above, preferably has a film thickness of less than or equal than 5 nm, and in the present embodiment, the film thickness is approximately 2 nm.

Figure 14C:
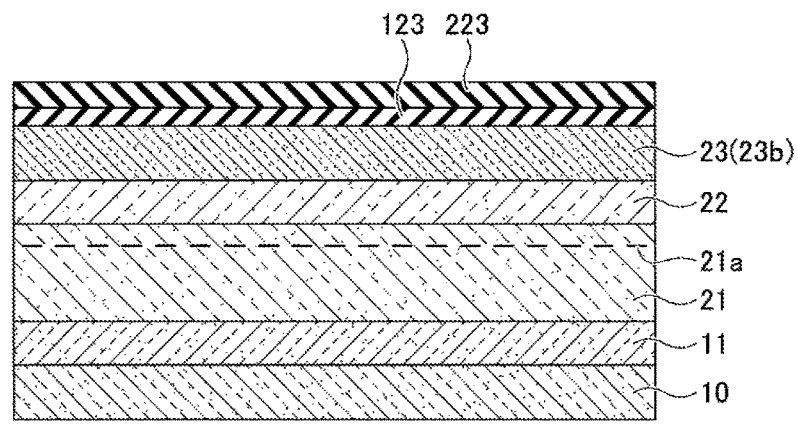

Next, as illustrated in FIG. 14C, the insulating film 223 is formed on the oxide film 123. Specifically, by performing plasma CVD (PECVD: plasma-enhanced chemical vapor deposition), an aluminum oxide film having a film thickness of 2 nm through 100 nm is formed on the oxide film 123, to form the insulating film 223. In the present embodiment, the insulating film 223 is formed, for example, by forming an aluminum oxide film having a film thickness of 20 nm, the insulating film 223 is formed.

Figure 15A:
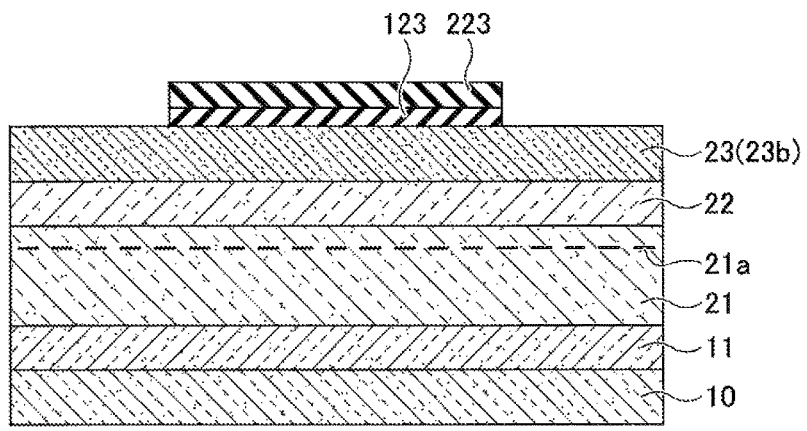
FIGS. 15A through 15C are process drawings of a method of manufacturing the semiconductor device according to the third embodiment (2)

Next, as illustrated in FIG. 15A, the insulating film 223 and the oxide film 123 are removed from the regions where the source electrode 32 and the drain electrode 33 are to be formed, and the electron supply layer 23 formed by the crystal inner layer 23b is exposed. Specifically, photoresist is applied on the insulating film 223, and exposing and developing are performed with an exposing device to form a resist pattern (not illustrated) having openings in the regions where the source electrode 32 and the drain electrode 33 are to be formed. Subsequently, wet etching is performed by using an alkali aqueous solution to remove the insulating film 223 and the oxide film 123 from the regions where the resist pattern is not formed, and to expose the surface of the electron supply layer 23 formed by the crystal inner layer 23b. The etching liquid that is used in the wet etching process is preferably an alkali aqueous solution such as KOH and TMAH, etc. It is preferable to form the insulating film 223 by the same aluminum oxide as that used for forming the oxide film 123, because it is possible to remove the insulating film 223 by the etching liquid that is used for removing the oxide film 123. Subsequently, the resist pattern (not illustrated) is removed with an organic solvent, etc.

Figure 15B:
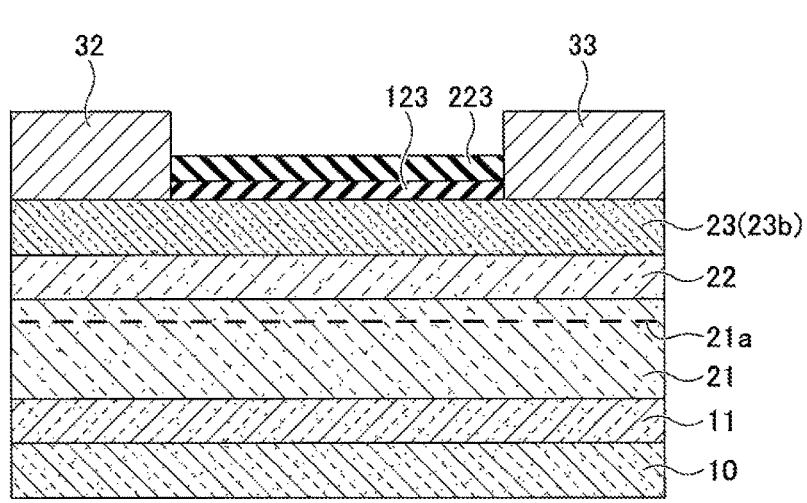

Next, as illustrated in FIG. 15B, the source electrode 32 and the drain electrode 33 are formed on the electron supply layer 23 formed by the crystal inner layer 23b.

Figure 15C:
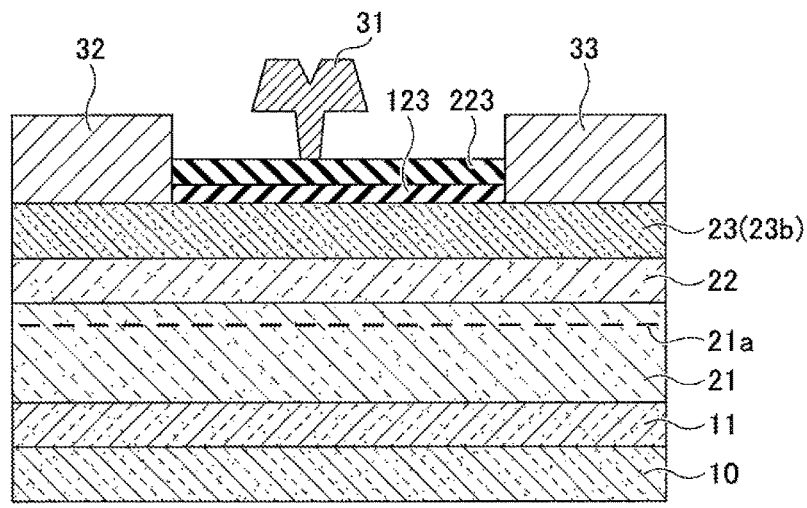

Next, as illustrated in FIG. 15C, the gate electrode 31 is formed on the insulating film 223.

According to the above processes, the semiconductor device according to the present embodiment is manufactured. The removal of the insulating film 223 and the oxide film 123 from the regions where the source electrode 32 and the drain electrode 33 are to be formed, may be performed by dry etching instead of by wet etching, although the properties of the semiconductor device may be slightly reduced.

Note that contents other than the above are the same as those of the first embodiment.

Fourth Embodiment

Figure 16:
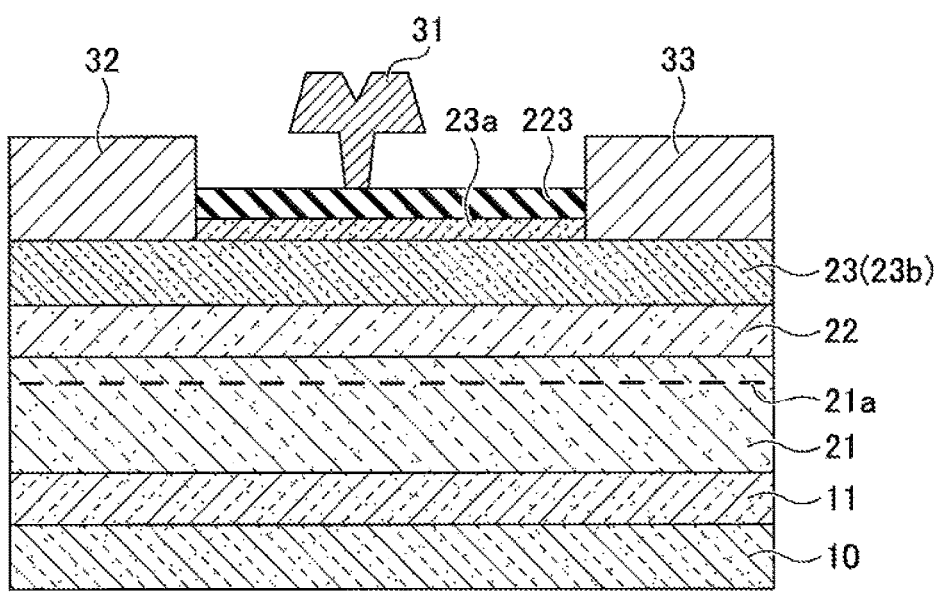
FIG. 16 is a structural diagram of a semiconductor device according to a fourth embodiment.

Next, a description is given of a fourth embodiment. As illustrated in FIG. 16, the semiconductor device according to the present embodiment has a structure in which the insulating film 223 is formed on the crystal surface layer 23a of the electron supply layer 23 in the semiconductor device according to the first embodiment, and the gate electrode 31 is formed on the insulating film 223. In the present embodiment, the insulating film 223 is described as being formed by aluminum oxide having a film thickness of 20 nm; however, the insulating film 223 may be a film having insulation properties such as silicon nitride, etc. In the present embodiment, similar to the first embodiment, the source electrode 32 and the drain electrode 33 are formed on the crystal inner layer 23b of the electron supply layer 23. By forming the insulating film 223 as described above, the gate leakage current is reduced.

(Manufacturing Method of Semiconductor Device—Fourth Embodiment)

Next, a description is given of the manufacturing method of the semiconductor device according to the present embodiment, by referring to FIGS. 17A through 18B.

Figure 17A:
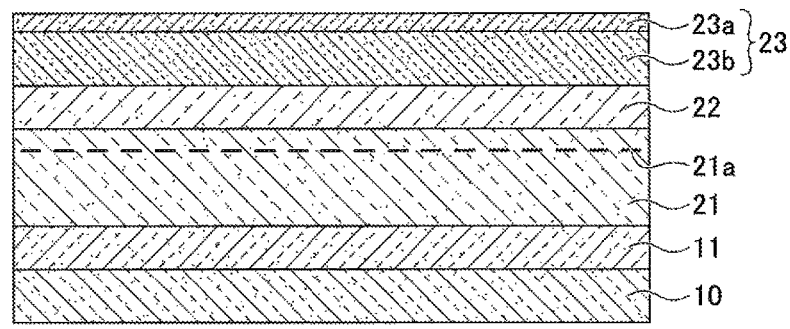
FIGS. 17A through 17C are process drawings of a method of manufacturing the semiconductor device according to the fourth embodiment (1)

First, as illustrated in FIG. 17A, by epitaxially growing nitride semiconductor layers, the buffer layer 11, the electron transport layer 21, the spacer layer 22, and the electron supply layer 23 are formed on the substrate 10. Subsequently, although not illustrated, an element separation region for separating the elements is formed. Accordingly, on the surface of the electron supply layer 23, the crystal surface layer 23a, which has a film thickness of approximately 2 nm and in which a part of the In is separated, is formed. The crystal surface layer 23a has a low composition ratio of In and a high composition ratio of Al, compared to those of the crystal inner layer 23b that is at a deeper part than the crystal surface layer 23a.

Figure 17B:
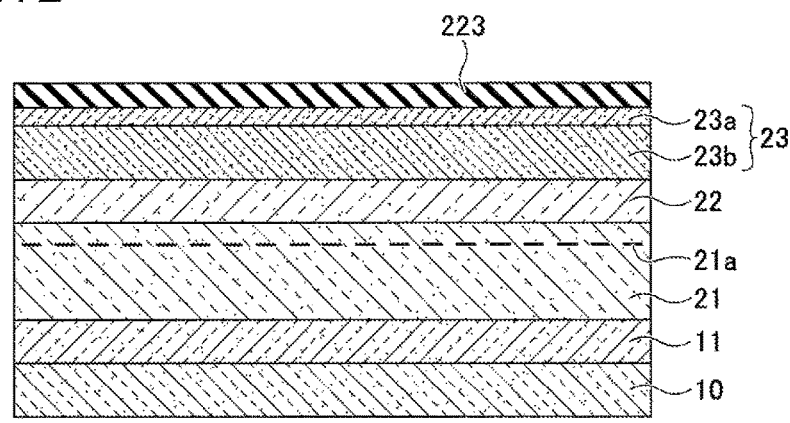

Next, as illustrated in FIG. 17B, the insulating film 223 is formed on the crystal surface layer 23a of the electron supply layer 23. Specifically, by forming an aluminum oxide film having a film thickness of 20 nm, the insulating film 223 is formed.

Figure 17C:
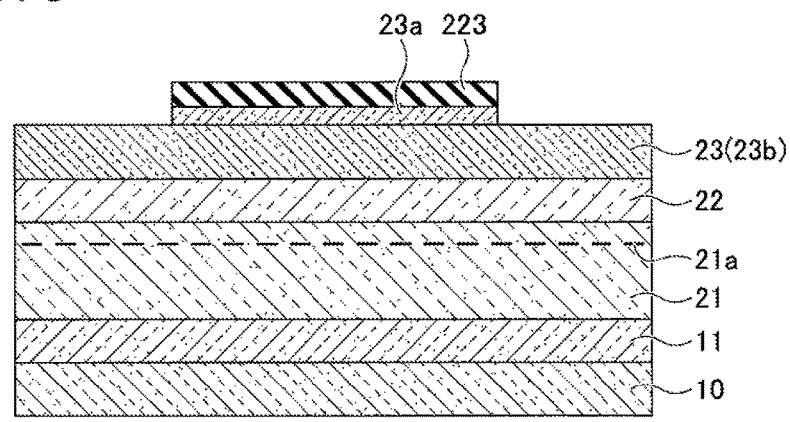

Next, as illustrated in FIG. 17C, the insulating film 223 and the crystal surface layer 23a are removed from the regions where the source electrode 32 and the drain electrode 33 are to be formed, and the crystal inner layer 23b of the electron supply layer 23 is exposed.

Figure 18A:
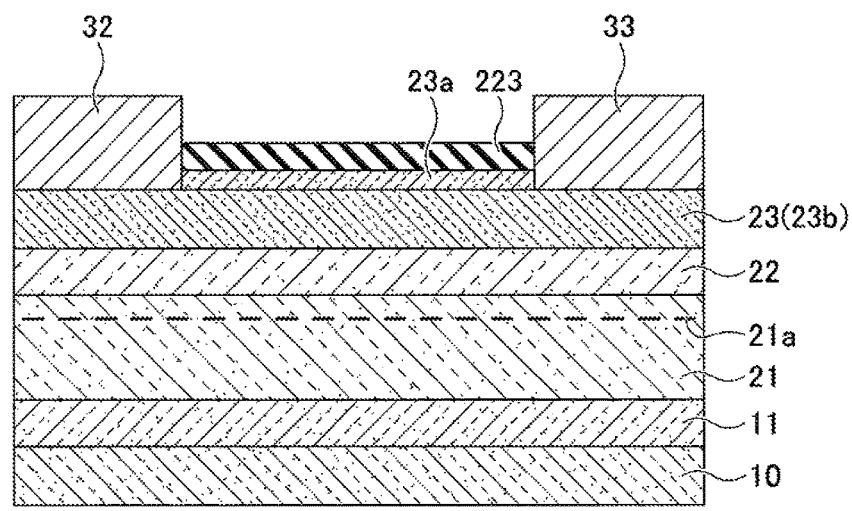
FIGS. 18A and 18B are process drawings of a method of manufacturing the semiconductor device according to the fourth embodiment (2)

Next, as illustrated in FIG. 18A, the source electrode 32 and the drain electrode 33 are formed on the crystal inner layer 23b of the electron supply layer 23.

Figure 18B:
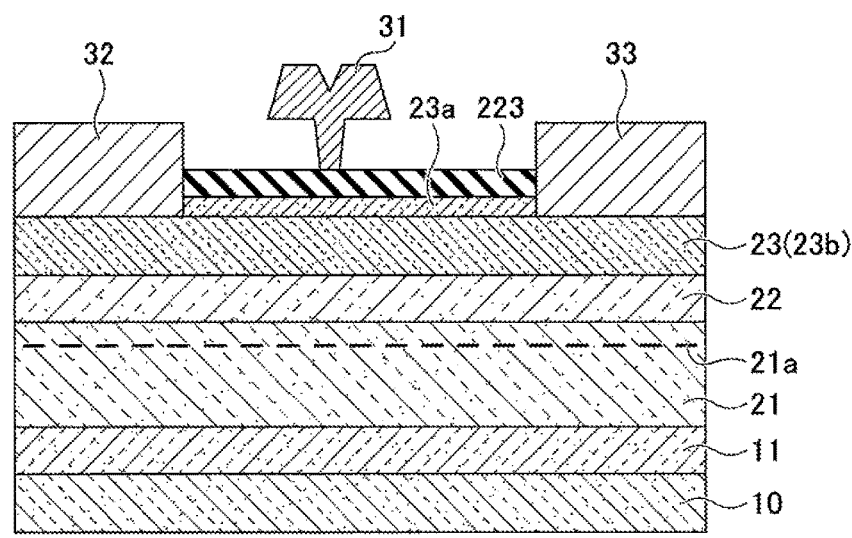

Next, as illustrated in FIG. 18B, the gate electrode 31 is formed on the insulating film 223.

According to the above processes, the semiconductor device according to the present embodiment is manufactured.

Note that contents other than the above are the same as those of the first embodiment. Furthermore, the present embodiment is also applicable to the semiconductor device according to the second through fourth embodiments.

Fifth Embodiment

Figure 19:
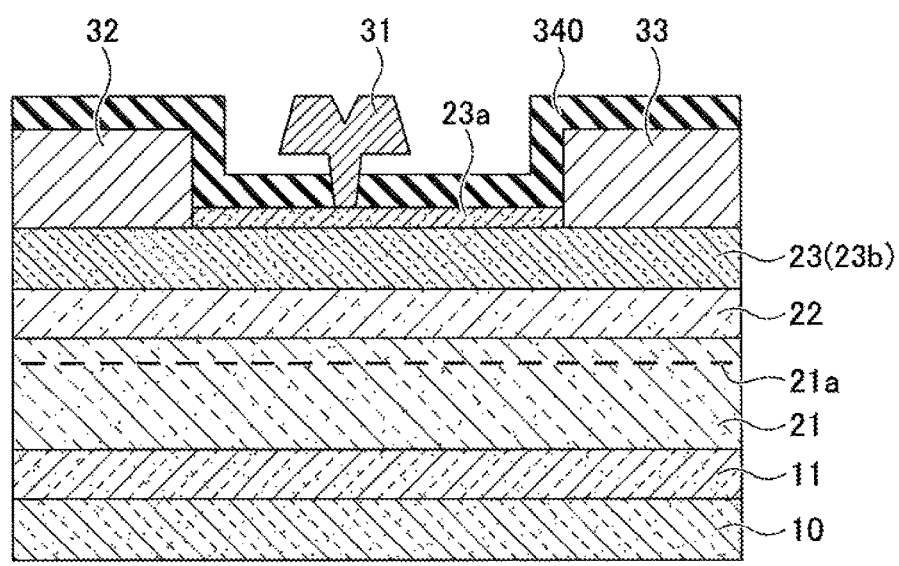
FIG. 19 is a structural diagram of a semiconductor device according to a fifth embodiment.

Next, a description is given of a fifth embodiment. As illustrated in FIG. 19, the semiconductor device according to the present embodiment has a structure in which a protection film 340 is formed on the crystal surface layer 23a of the electron supply layer 23, in the semiconductor device according to the first embodiment.

In the manufacturing method of the semiconductor device according to the present embodiment, the same processes as those illustrated in FIGS. 6A through 6C of the manufacturing method of the semiconductor device according to the first embodiment, are performed.

Figure 20A:
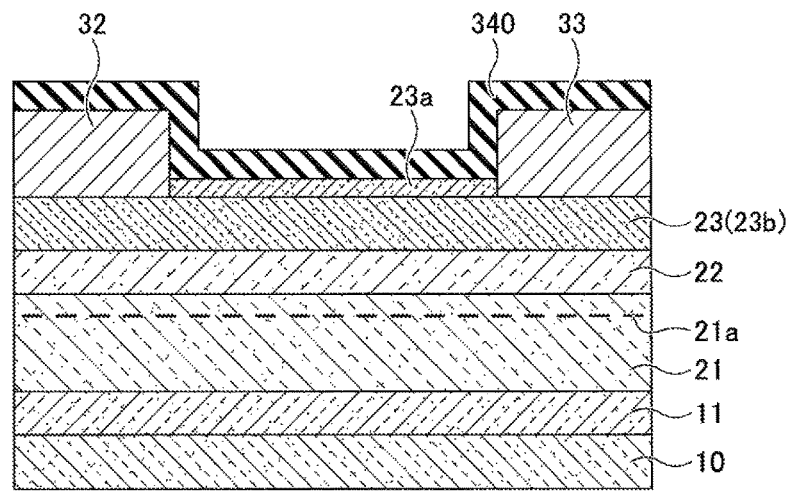
FIGS. 20A through 20C are process drawings of a method of manufacturing the semiconductor device according to the fifth embodiment.

Subsequently, as illustrated in FIG. 20A, the protection film 340 is formed by SiN on the crystal surface layer 23a of the electron supply layer 23. Specifically, by plasma CVE, etc., a SiN film having a film thickness of 10 nm through 100 nm is formed, to form the protection film 340. Other than SiN, the protection film 340 may be formed of $Al_2O_3$, $HfO_2$, $SiO_2$, SiON, AlN, and AlON, etc.

Figure 20B:
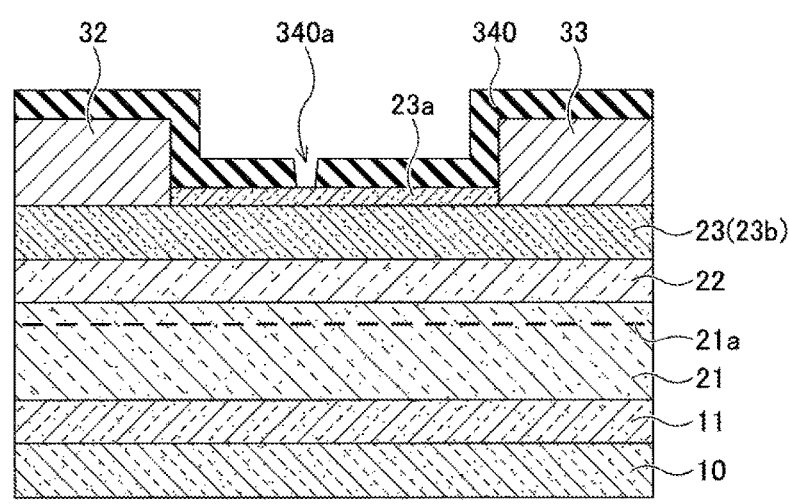

Next, as illustrated in FIG. 20B, an opening part 340a is formed in the protection film 340, in the region where the gate electrode 31 is to be formed. Specifically, photoresist is applied on the protection film 340, and exposing and developing are performed with an exposing device to form a resist pattern (not illustrated) having an opening in the region where the gate electrode 31 is to be formed. Subsequently, the protection film 340, which is exposed at the opening of the resist pattern, is removed by dry etching such as RIE, etc., using fluorine-based gas as the etching gas, to expose the crystal surface layer 23a of the electron supply layer 23. Accordingly, the protection film 340, which has the opening part 340a formed in the region where the gate electrode 31 is to be formed, is formed. Subsequently, the resist pattern is removed with an organic solvent, etc.

Figure 20C:
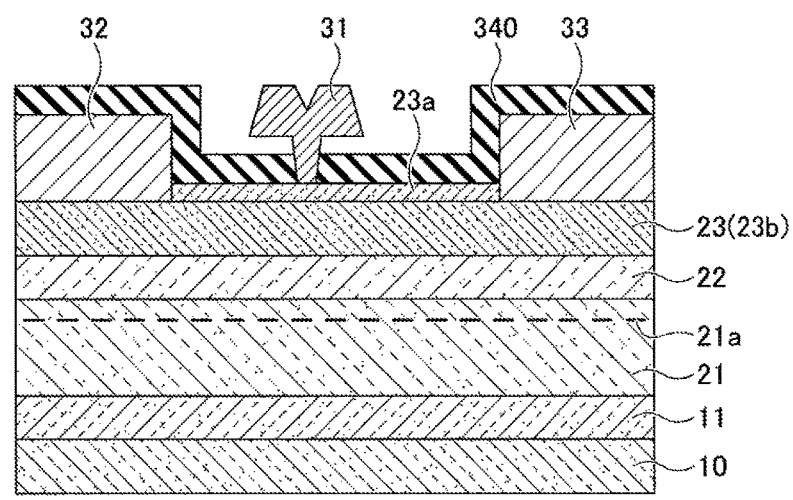

Next, as illustrated in FIG. 20C, the gate electrode 31 is formed on the crystal surface layer 23a of the electron supply layer 23.

According to the above processes, the semiconductor device according to the present embodiment is manufactured.

Note that contents other than the above are the same as those of the first embodiment.

Sixth Embodiment

Next, a description is given of a sixth embodiment. The present embodiment is relevant to a semiconductor device, a power unit, and a high-frequency amplifier.

Figure 21:
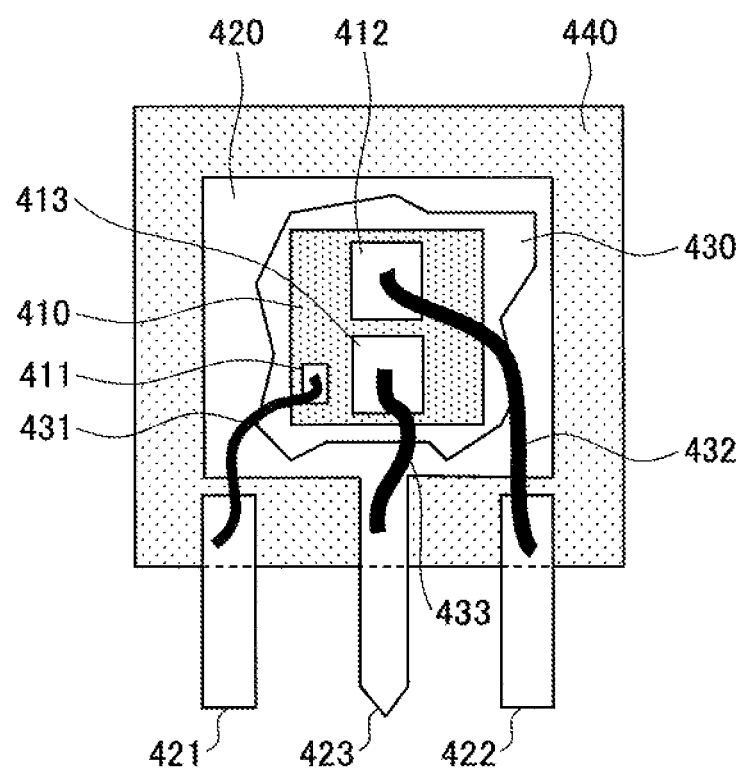
FIG. 21 illustrates a discretely packaged semiconductor device according to a sixth embodiment.

The semiconductor device according to the present embodiment is formed by discretely packaging the semiconductor device according to any one of the first through fifth embodiments. A description is given of this discretely packaged semiconductor device with reference to FIG. 21. FIG. 21 schematically illustrates the inside of the discretely packaged semiconductor device, in which the locations of electrodes are different from those of the first through fifth embodiments. Furthermore, in the present embodiment, a description may be given of a case where one HEMT or one transistor having a UMOS structure is formed in the semiconductor device according to any one of the first through fifth embodiments.

First, the semiconductor device manufactured according to any one of the first through fifth embodiments is cut by dicing, and a semiconductor chip 410 that is a HEMT, etc., made of a GaN system material is formed. The semiconductor chip 410 is fixed on a lead frame 420 by a die-attach agent 430 such as solder. Note that the semiconductor chip 410 corresponds to the semiconductor device according to any one of the first through fifth embodiments.

Next, a gate electrode 411 is connected to a gate lead 421 by a bonding wire 431, a source electrode 412 is connected to a source lead 422 by a bonding wire 432, and a drain electrode 413 is connected to a drain lead 423 by a bonding wire 433. The bonding wires 431, 432, and 433 are formed by a metal material such as Al. Furthermore, in the present embodiment, the gate electrode 411 is a gate electrode pad, which is connected to the gate electrode 31 of the semiconductor device according to any one of the first through fifth embodiments. Furthermore, the source electrode 412 is a source electrode pad, which is connected to the source electrode 32 of the semiconductor device according to any one of the first through fifth embodiments. Furthermore, the drain electrode 413 is a drain electrode pad, which is connected to the drain electrode 33 of the semiconductor device according to any one of the first through fifth embodiments.

Next, resin sealing is performed with mold resin 440 by a transfer mold method. As described above, a discretely packaged semiconductor chip that is a HEMT, etc., made of a GaN system material is manufactured.

Next, a description is given of a power unit and a high-frequency amplifier according to the present embodiment. The power unit and the high-frequency amplifier according to the present embodiment use the semiconductor device according to any one of the first through fifth embodiments.

Figure 22:
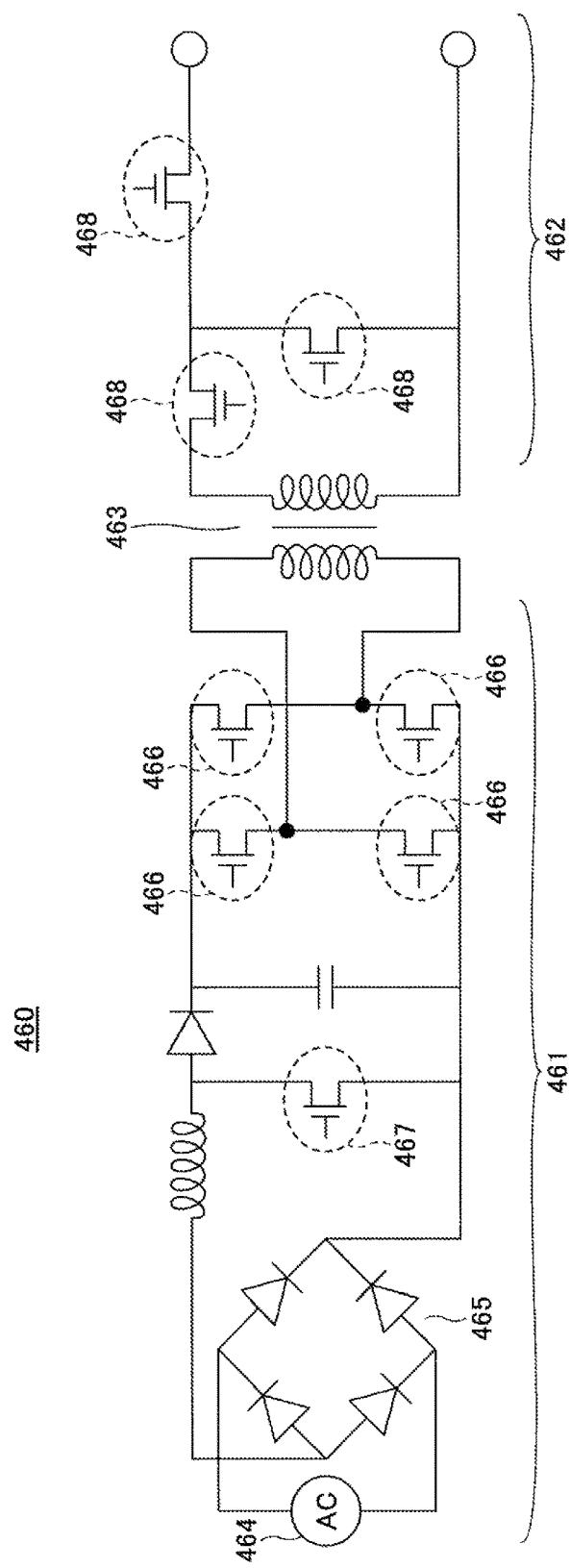
FIG. 22 is a circuit diagram of a power unit according to the sixth embodiment.

First, with reference to FIG. 22, a description is given of the power unit according to the present embodiment. A power unit 460 according to the present embodiment includes a high voltage primary side circuit 461, a low voltage secondary side circuit 462, and a transformer 463 disposed between the high voltage primary side circuit 461 and the low voltage secondary side circuit 462. The high voltage primary side circuit 461 includes an AC (alternating-current) source 464, what is termed as a bridge rectifier circuit 465, plural switching elements (four in the example of FIG. 22) 466, and one switching element 467. The low voltage secondary side circuit 462 includes plural switching elements 468 (three in the example of FIG. 22). In the example of FIG. 22, the semiconductor device according to any one of the first through fifth embodiments is used as the switching elements 466 and the switching element 467 of the high voltage primary side circuit 461. The switching elements 466 and 467 of the high voltage primary side circuit 461 are preferably normally-off semiconductor devices. Furthermore, switching elements 468 used in the low voltage secondary side circuit 462 are typical MISFET (Metal Insulator Semiconductor Field Effect Transistor) made of silicon.

Figure 23:
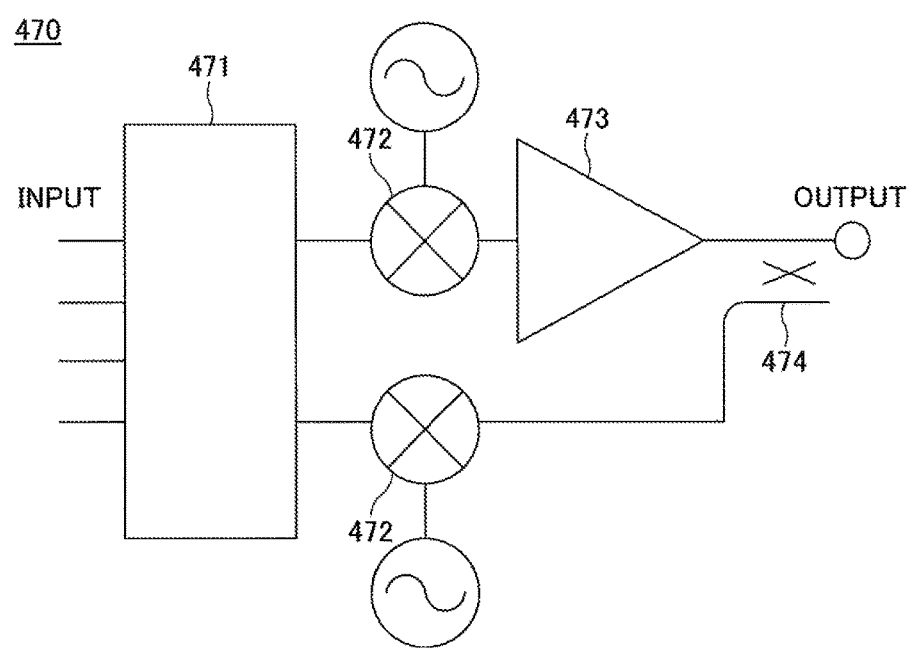
FIG. 23 illustrates a high-frequency amplifier according to the sixth embodiment.

Next, with reference to FIG. 23, a description is given of the high-frequency amplifier according to the present embodiment. A high-frequency amplifier 470 according to the present embodiment may be applied to a power amplifier of a base station of mobile phones. The high-frequency amplifier 470 includes a digital predistortion circuit 471, mixers 472, a power amplifier 473, and a directional coupler 474. The digital predistortion circuit 471 compensates for the non-linear distortions of input signals. The mixers 472 mix the input signals, whose non-linear distortions have been compensated, with AC signals. The power amplifier 473 amplifies the input signals that have been mixed with the AC signals. In the example of FIG. 23, the power amplifier 473 includes the semiconductor device according to any one of the first through fifth embodiments. The directional coupler 474 monitors input signals and output signals. In the circuit of FIG. 23, for example, the switch may be switched so that output signals are mixed with AC signals by the mixers 472 and sent to the digital predistortion circuit 471.

According to an aspect of the embodiments, it is possible to decrease the ON-resistance in a semiconductor device in which In and Al are included in the electron supply layer.

The present invention is not limited to the specific embodiments described herein, and variations and modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a first semiconductor layer formed of a compound semiconductor, provided over a substrate;
a second semiconductor layer formed of a compound semiconductor including In and Al, provided over the first semiconductor layer;
a source electrode and a drain electrode provided on the second semiconductor layer; and
a gate electrode provided between the source electrode and the drain electrode, on the second semiconductor layer, wherein
the compound semiconductor in the second semiconductor layer has a first In composition ratio in a region of the second semiconductor layer on a side facing the substrate and a second In composition ratio in a region of the second semiconductor layer on a side opposite to the side facing the substrate, the second In composition ratio being a lower In composition ratio than the first In composition ratio,
the source electrode and the drain electrode are provided in contact with the region having the first In composition ratio, and the gate electrode is provided on the region having the second In composition ratio,
the first semiconductor layer and the second semiconductor layer are formed of a nitride semiconductor, and
an N composition ratio in the region having the second In composition ratio is higher than an N composition ratio in the region having the first In composition ratio.

2. The semiconductor device according to claim 1, wherein an Al composition ratio in the region having the second In composition ratio is higher than an Al composition ratio in the region having the first In composition ratio.

3. The semiconductor device according to claim 1, wherein
an insulating film is formed on the region having the second In composition ratio in the second semiconductor layer between the source electrode and the drain electrode, and
the gate electrode is formed on the insulating film.

4. The semiconductor device according to claim 3, wherein the insulating film is formed of a material including aluminum oxide.

5. The semiconductor device according to claim 1, wherein the second semiconductor layer is formed of a material including InAlN or InAlGaN.

6. The semiconductor device according to claim 1, wherein the first semiconductor layer is formed of a material including GaN.

7. A power supply device comprising the semiconductor device according to claim 1.

8. An amplifier comprising the semiconductor device according to claim 1.

9. A semiconductor device comprising:
a first semiconductor layer formed of a compound semiconductor, provided over a substrate;
a second semiconductor layer formed of a compound semiconductor including In and Al, provided over the first semiconductor layer;
a source electrode and a drain electrode formed in contact with the second semiconductor layer;
an oxide film formed on the second semiconductor layer between the source electrode and the drain electrode; and
a gate electrode formed on the oxide film, wherein
the oxide film includes aluminum oxide,
the compound semiconductor in the second semiconductor layer has a first In composition ratio in a region of the second semiconductor layer on a side facing the substrate and a second In composition ratio in a region of the second semiconductor layer on a side opposite to the side facing the substrate, the second In composition ratio being a lower In composition ratio than the first In composition ratio,
the first semiconductor layer and the second semiconductor layer are formed of a nitride semiconductor, and
an N composition ratio in the region having the second In composition ratio is higher than an N composition ratio in the region having the first In composition ratio.

10. The semiconductor device according to claim 9, wherein
an insulating film is formed on the oxide film, and
the gate electrode is formed on the insulating film.

* * * * *